United States Patent
Chu

(10) Patent No.: US 9,331,693 B2
(45) Date of Patent: May 3, 2016

(54) TOUCH DISPLAY DEVICE

(71) Applicant: E Ink Holdings Inc., Hsinchu (TW)

(72) Inventor: Chun-Wei Chu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 73 days.

(21) Appl. No.: 14/242,878

(22) Filed: Apr. 2, 2014

(65) Prior Publication Data

US 2015/0096877 A1  Apr. 9, 2015

(30) Foreign Application Priority Data

Oct. 8, 2013  (TW) .............................. 102136407 A

(51) Int. Cl.
*G02B 26/00* (2006.01)
*H03K 17/96* (2006.01)
*G06F 3/044* (2006.01)

(52) U.S. Cl.
CPC ............ *H03K 17/9622* (2013.01); *G06F 3/044* (2013.01); *H03K 2217/96031* (2013.01)

(58) Field of Classification Search
USPC ......................................... 359/296; 345/107
See application file for complete search history.

(56) References Cited

U.S. PATENT DOCUMENTS

| 7,474,295 | B2 * | 1/2009 | Matsuda ...................... 345/107 |
| 8,184,357 | B2 | 5/2012 | Yeo et al. |
| 2002/0063673 | A1 | 5/2002 | Kawai |
| 2004/0032390 | A1 | 2/2004 | Liang et al. |
| 2004/0257635 | A1 | 12/2004 | Paolini, Jr. et al. |
| 2005/0007651 | A1 | 1/2005 | Liang et al. |
| 2006/0285195 | A1 | 12/2006 | Moriyama et al. |
| 2008/0117495 | A1 | 5/2008 | Arango et al. |
| 2010/0060974 | A1 | 3/2010 | Wang et al. |
| 2010/0309111 | A1 | 12/2010 | Wang et al. |

\* cited by examiner

*Primary Examiner* — Tuyen Tra
(74) *Attorney, Agent, or Firm* — Jianq Chyun IP Office

(57) ABSTRACT

A touch display device including a substrate, a display medium layer disposed above the substrate, first side electrodes and a sensing electrode disposed above the substrate is provided. The display medium layer includes charged particles and micro-structures connected to each other. Each of the micro-structures holds a portion of the charged particles, and has a first side wall which is not parallel to the substrate. Each of the first side electrodes is disposed above the first side wall of each of the micro-structures. The micro-structures are disposed between the substrate and the first side electrodes. A touch sensing unit is composed by the sensing electrode and the first side electrodes.

13 Claims, 7 Drawing Sheets

TOUCH DISPLAY DEVICE

CROSS-REFERENCE TO RELATED APPLICATION

This application claims the priority benefit of Taiwan application serial no. 102136407, filed on Oct. 8, 2013. The entirety of the above-mentioned patent application is hereby incorporated by reference herein and made a part of this specification.

BACKGROUND OF THE INVENTION

1. Field of the Invention

The invention relates to a display device, and particularly to a touch display device 2. Description of Related Art The known touch display device, such as an electrophoretic display device with a touch function, is to dispose a touch sensing unit on the exterior of the electrophoretic display panel, which allows it to have the touch function. However, the touch sensing unit plugged on the exterior of the electrophoretic display panel makes the electrophoretic display device hard to be thinned.

Furthermore, most of the known electrophoretic display devices are reflective display devices. The reflective electrophoretic display device is using electrophoretic particles in the interior thereof to reflect outer light beams, which achieves the goal of screen display. However, the known electrophoretic display devices have the problems of low brightness and low color saturation.

SUMMARY OF THE INVENTION

The invention is directed to a touch display device, which has an advantage of thinness.

A touch display device of the invention includes a substrate, a display medium layer which is disposed above the substrate, the first side electrodes, and a sensing electrode which is disposed above the substrate. The display medium layer includes charged particles and micro-structures which are connected to each other. Each of the micro-structures holds a portion of the charged particles and has the first side wall which is not parallel to the substrate. Each of the first side electrodes is disposed above the first side wall of each of the micro-structures. The micro-structures are disposed between the substrate and the first side electrodes. The sensing electrode and the first side electrodes compose a touch sensing unit.

In an embodiment of the invention, the substrate is disposed between the sensing electrode and the micro-structures.

In an embodiment of the invention, the touch display device further includes the second side electrodes. The second side electrodes are electrically insulated to the first side electrodes. Each of the second side electrodes is disposed above the second side wall of each of the micro-structures. The second side wall is opposite to the first side wall and is not parallel to the substrate. The micro-structures are disposed between the substrate and the second side electrodes.

In an embodiment of the invention, the first side electrodes, the second side electrodes, and the sensing electrode compose the touch sensing unit.

In an embodiment of the invention, the touch display device further includes a front electrode and a back electrode, wherein the front electrode is disposed between the substrate and the micro-structures. The first side electrodes and the second side electrodes are disposed between the front electrode and the back electrode.

In an embodiment of the invention, the touch display device further includes a backlight unit. The display medium layer, the first side electrodes, and the second side electrodes are disposed between the substrate and the backlight unit.

In an embodiment of the invention, the touch display device further includes a color filter layer. The backlight unit emits a light beam and the color filter layer is disposed in a transmission path of the light beam.

In an embodiment of the invention, a voltage applied to one of the first side electrodes which are corresponded to one of the micro-structures is positive, the voltage applied to one of the second side electrodes which are corresponded to one of the micro-structures is negative, and the two voltages applied respectively to the front electrode and the back electrode are zero. The backlight unit emits a light beam, and the light beam passes through the display medium layer.

In an embodiment of the invention, the voltage applied to the first side electrode which is corresponded to one of the micro-structures and the voltage applied to the second side electrode which is corresponded to the micro-structure are zero, a voltage applied to one of the front electrode and the back electrode is positive, and a voltage applied to the another of the front electrode and the back electrode is negative.

In an embodiment of the invention, the charged particles are divided into the first particles and the second particles, wherein the first particles and the second particles have opposite electrical properties.

In an embodiment of the invention, the first particles are white particles, and the second particles are black particles.

In an embodiment of the invention, the first particles are colorful, and the second particles are black or white.

In an embodiment of the invention, the voltage applied to one of the first side electrodes which are corresponded to one of the micro-structures is zero, the voltage applied to one of the second side electrodes which are corresponded to one of the micro-structures is zero, the voltage applied to the front electrode is one of a positive voltage and a negative voltage, and the voltage applied to the back electrode is another one of the positive voltage and the negative voltage.

In an embodiment of the invention, the charged particles have the same electrical properties and are the same color, black, or white.

According to the above, in an embodiment of the invention, the touch sensing unit of the touch display device is composed by the first side electrodes which are disposed in the interior and the sensing electrode. Thereby, the touch display device has the advantage of thinness.

In order to make the aforementioned and other features and advantages of the invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The First Embodiment

Figure 1:
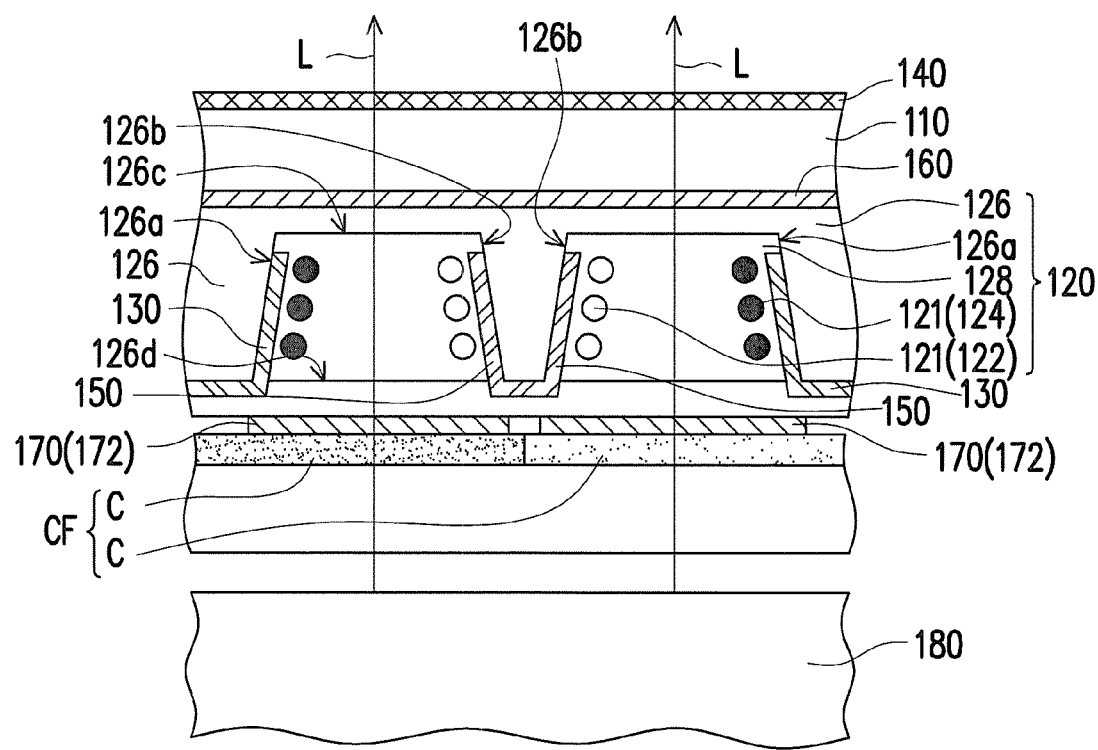
FIG. 1 illustrates a schematic cross-sectional view of a touch display device according to the first embodiment of the invention.
Figure 2:
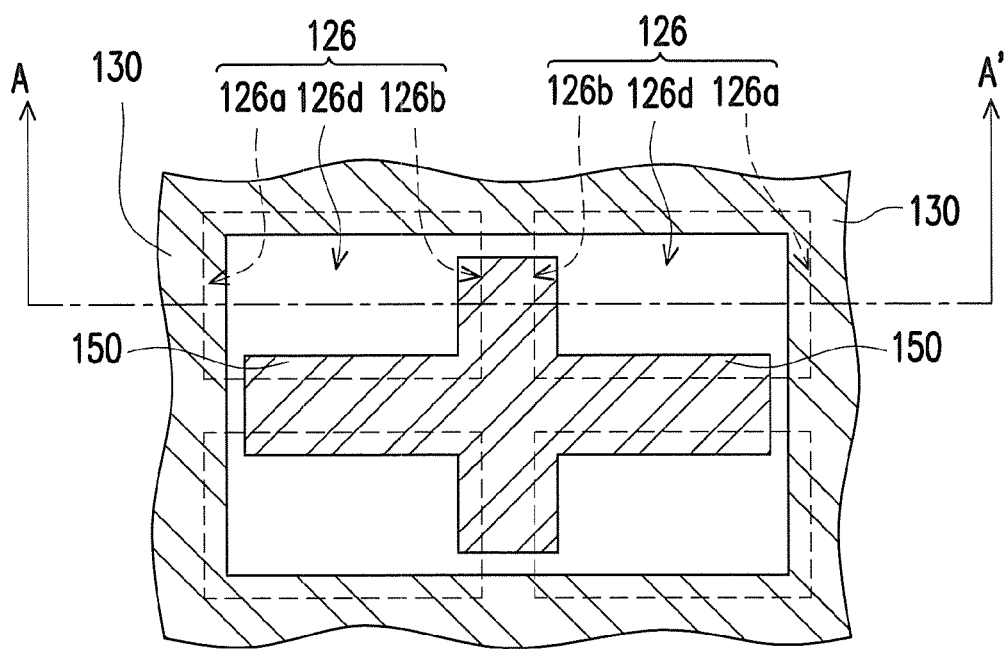
FIG. 2 illustrates a schematic top view of the first side electrodes, the second side electrodes, and the micro-structures of FIG. 1.

FIG. 1 illustrates a schematic cross-sectional view of a touch display device according to the first embodiment of the invention. FIG. 2 illustrates a schematic top view of the first side electrodes, the second side electrodes, and the micro-structures of FIG. 1. Particularly, FIG. 1 is a section corresponding to a line A-A' in FIG. 2. Please refer to FIG. 1 and FIG. 2, the touch display device 100 includes a substrate 110, a display medium layer 120 which are disposed above the substrate 110, and the first side electrodes 130. The display medium layer 120 includes charged particles 121, micro-structures 126 which are connected to each other, and a solution for electrophoresis 128. The charged particles 121 may be divided into the first particles 122 and the second particles 124. Each of the micro-structures 126 holds a portion of the first particles 122, a portion of the second particles 124, and a portion of the solution for electrophoresis 128. The first particles 122 and the second particles 124 have opposite electrical properties. For instance, in the present embodiment, the first particles 122 may be positively charged, the second particles 124 may be negatively charged, and the solution for electrophoresis 128 may be a transparent liquid. However, the invention is not limited thereto. In another embodiment, the first particles 122 may also be negatively charged, the second particles 124 may also be positively charged, and the solution for electrophoresis 128 may also be a black or a colorful liquid. In the present embodiment, the micro-structures 126 may be a micro-cup. However, the invention is not limited thereto. The micro-structures 126 may be any structures having chambers.

Each of the micro-structures 126 has the first side wall 126a which is not parallel to the substrate 110. In other words, each of the micro-structures 126 may have the first side wall 126a which is perpendicular to or inclined to the substrate 110. In the present embodiment, each of the micro-structures 126 may further have a top surface 126c and a bottom surface 126d, wherein the top surface 126c is parallel to the substrate 110 and the bottom surface 126d is opposite to the top surface 126c. The first side wall 126a connects the top surface 126c and the bottom surface 126d. The top surface 126c is disposed between the substrate 110 and the first side wall 126a.

The touch display device 100 includes the first side electrodes 130. Each of the first side electrodes 130 is disposed above the first side wall 126a of each of the micro-structures 126, wherein the micro-structures 126 are disposed between the substrate 110 and the first side electrodes 130. The touch display device 100 includes a sensing electrode 140 which is disposed above the substrate 110. In the present embodiment, the sensing electrode 140 may be a transparent electrode. The substrate 110 may be disposed between the sensing electrode 140 and the micro-structures 126. In other words, the first side electrodes 130 and the sensing electrode 140 may be disposed on two opposite sides of the substrate 110. However, the invention is not limited thereto. In another embodiment, through appropriate designs, the first side electrodes 130 and the sensing electrode 140 may also be disposed on the same side of the substrate 110. It is noted that a touch sensing unit may be composed by the sensing electrode 140 and the first side electrodes 130. Through a capacitance change between the sensing electrode 140 and the first side electrodes 130, the touch display device 100 may sense positions touched by the users. Since the touch display device 100 is to use the first side electrodes 130 which are disposed in the interior thereof as one of the sensing layers, the touch display device 100 has the advantage of thinness.

In the present embodiment, the touch display device 100 may further include the second side electrodes 150 which are electrically insulated to the first side electrodes 130. Each of the second side electrodes 150 may be disposed above the second side wall 126b of each of the micro-structures 126, wherein the second side wall 126b is opposite to the first side wall 126a and is not parallel to the substrate 110. The micro-structures 126 are disposed between the substrate 110 and the second side electrodes 150. As shown in FIG. 2, the second side electrode 150 which is disposed in one of the micro-structures 126 (such as the micro-structure 126 in the upper left corner) may be directly connected to the second side electrode 150 which is disposed in the adjacent micro-structure 126 (such as the micro-structure 126 in the upper right corner). The first side electrode 130 which is disposed in one of the micro-structures 126 (such as the micro-structure 126 in the upper left corner) may also be directly connected to the first side electrode 130 which is disposed in the adjacent micro-structure 126 (such as the micro-structure 126 in the upper right corner). The touch sensing unit may be composed by the second side electrodes 150, the first side electrodes 130, and a sensing electrode 140. The added second side electrodes 150 may allow the touch sensing unit to sense the positions touched by the users more precisely.

Referring again to FIG. 1, the touch display device 100 of the invention may further include a front electrode 160 and a back electrode 170 which are disposed between the substrate 110 and the micro-structures 126. The back electrode 170 includes back sub-electrodes 172 which are electrically insulated to each other. Each of the back sub-electrodes 172 completely covers one of the micro-structures 126. The display medium layer 120, the first side electrodes 130, and the second side electrodes 150 are disposed between the front electrode 160 and the back electrode 170. In the present embodiment, the front electrode 160 and the back electrode 170 may be the transparent electrodes, wherein the material thereof may be indium tin oxides, indium zinc oxides, aluminium tin oxides, aluminium zinc oxides, indium germanium zinc oxides, or other appropriate transparent conductive materials. However, the invention is not limited thereto. The materials of the front electrode 160 and the back electrode 170 may be suitably selected depending on the display modes of the touch display device 100.

The touch display device 100 of the invention may further include a backlight unit 180. The display medium layer 120, the first side electrodes 130, and the second side electrodes 150 may be disposed between the substrate 110 and the backlight unit 180. The backlight unit 180 may be a light emitting diode or other suitable light sources. The touch display device 100 may further include a color filter layer CF. In the present embodiment, the color filter layer CF may include color patterns C of different colors, and each of the color patterns C may overlap one of the micro-structures 126 respectively. In the present embodiment, color patterns C may be red patterns, green patterns, and blue patterns, wherein the red patterns, the green patterns, and the blue patterns may be arranged sequentially. However, the invention is not limited thereto. The color filter layer CF may also include the color patterns C of other colors, and may be disposed in other ways. Through the backlight unit 180 and the color filter layer CF, the touch display device 100 of the invention may have high brightness and high color saturation. The following is illustrated according to FIG. 1 and FIG. 3.

FIG. 1 illustrates a case in which part of the region in the touch display device is in a bright state. Referring to FIG. 1, when the region in which one of the micro-structures 126 disposed is to be made in the bright state by the touch display device 100, the first side electrodes 130 and the second side electrodes 150 which correspond to the micro-structures 126 (Herein, the first side electrodes 130 and the second side electrodes 150 which correspond to the micro-structures 126 refers to the first side electrodes 130 and the second side electrodes 150 which are disposed in the micro-structures 126) may be operated by the touch display device 100 in the following manner. Specifically, a positive voltage may be applied to the first side electrode 130 which corresponds to the micro-structure 126, a negative voltage may be applied to the second side electrode 150 which corresponds to the micro-structure 126, no voltage may be applied to the front electrode 160 and the back electrode 170, and the backlight unit 180 is made to emit a light beam L. At this point, the positively charged first particles 122 and the negatively charged second particles 124 may be attracted by the second side electrodes 150 and the first side electrodes 130 respectively and move to the second side wall 126b and the first side wall 126a of the micro-structures 126 respectively, thereby exposing the top surface 126c and the bottom surface 126d of the micro-structures 126. Accordingly, the light beam L can then pass through the display medium layer 120, making the region of the touch display device 100 in which the micro-structures 126 disposed to be in the bright state. Furthermore, the light beam L can pass through the color patterns C which overlap the micro-structures 126, further making the touch display device 100 to display a full-color screen.

It should be noted that since the touch display device 100 is using the light beam L of the backlight unit 180 to pass through the display medium layer 120 to be in the bright state, the touch display device 100 of the invention has the high brightness compared to reflective display devices. Furthermore, through combinations of the color filter layer CF and the spectrum of the light beam L from the backlight unit 180, the touch display device 100 of the invention may further have the high color saturation.

Figure 3:
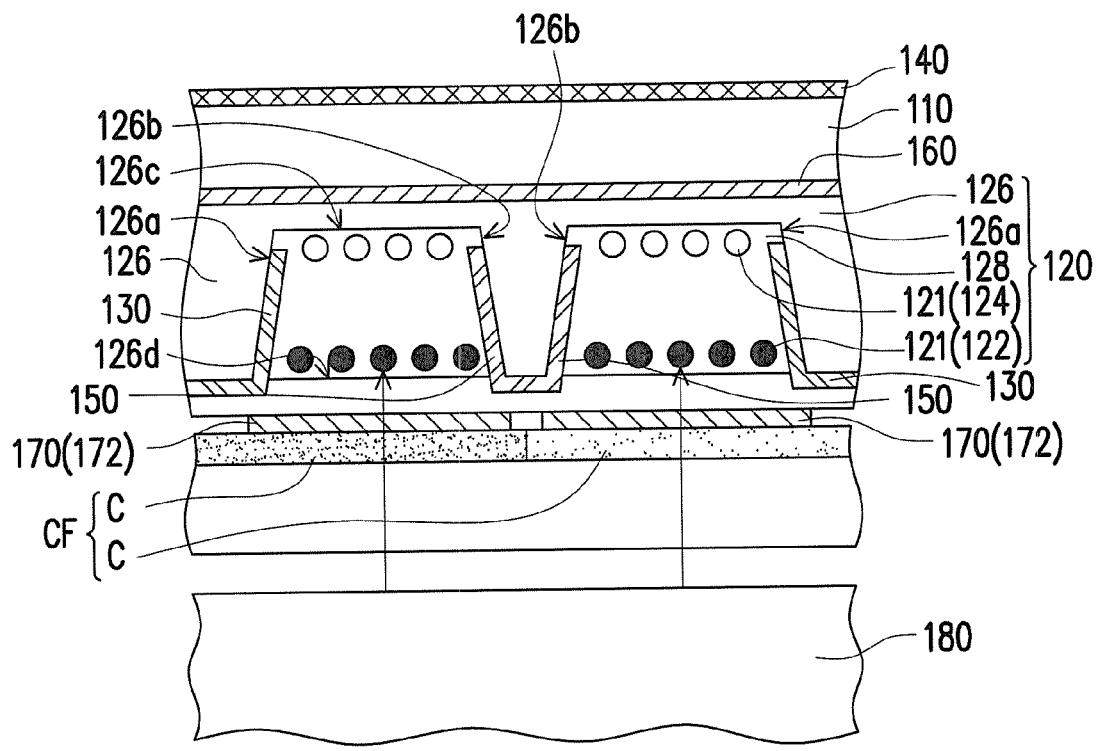
FIG. 3 illustrates a case in which part of the region in the touch display device of FIG. 1 is in a dark state.

FIG. 3 illustrates a case in which part of the region in the touch display device of FIG. 1 is in a dark state. Please refer to FIG. 3, when the region in which one of the micro-structures 126 disposed is to be made in the dark state by the touch display device 100, the first side electrodes 130 and the second side electrodes 150 which correspond to the micro-structures 126 may be operated by the touch display device 100 in the following manner. Specifically, no voltage may be applied to the first side electrode 130 and the second side electrode 150 which correspond to the micro-structure 126, the negative voltage is applied to the front electrode 160, and the positive voltage is applied to the back electrode 170. At this point, the positively charged first particles 122 and the negatively charged second particles 124 may be attracted by the front electrode 160 and the back electrode 170 respectively and cover the top surface 126c and the bottom surface 126d of the micro-structures 126 respectively. Accordingly, the light beam L may be shielded by the first particles 122 and the second particles 124, making the region which corresponds to the micro-structures 126 of the touch display device 100 to be in the bright state.

The Second Embodiment

Figure 4:
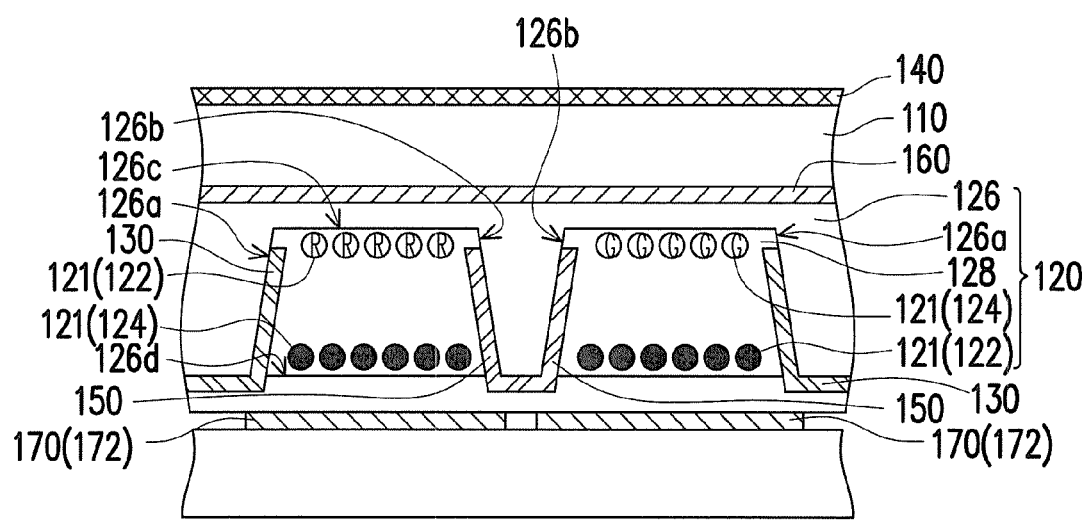
FIG. 4 illustrates a schematic cross-sectional view of a touch display device according to the second embodiment of the invention.

FIG. 4 illustrates a schematic cross-sectional view of a touch display device according to the second embodiment of the invention. Referring to FIG. 4, the touch display device 100A of the present embodiment is similar to the touch display device 100 in the first embodiment, and thus the same reference numbers are used to refer to the same or like elements. The main differences between the touch display device 100A and the touch display device 100 are that the colors of the first particles 122 and the second particles 124 in the touch display device 100A are not the same as those in the touch display device 100, and driving modes of the touch display device 100A and the touch display device 100 are also not the same. The differences between the both are illustrated in the following, and the similar parts of the both are not reiterated herein.

In the present embodiment, the first particles 122 may be colorful, and the second particles 124 may be black or white. The colorful first particles 122 may replace the functions of the color filter layer CF in the first embodiment. For instance, the first particles 122 in a micro-structure 126 may have the red color and the second particles 124 may be black, the first particles 122 in another micro-structure 126 may have the green color and the second particles 124 may be black, and the first particles 122 in still another micro-structure 126 may have the blue color and the second particles 124 may be black.

In the present embodiment, no voltage may be applied to the first side electrode 130 which corresponds to one of the micro-structures 126, no voltage may be applied to the second side electrode 150 which corresponds to one of the micro-structures 126, the negative voltage may be applied to the front electrode 160, and the positive voltage may be applied to the back electrode 170. At this point, the positively charged first particles 122 and the negatively charged second particles 124 may be attracted by the front electrode 160 and the back electrode 170 respectively and cover the top surface 126c and the bottom surface 126d of the micro-structures 126 respectively. At this point, by viewing along the substrate 110 toward the micro-structures 126, the regions which correspond to the micro-structures 126 in the touch display device 100A may present the color of the first particles 122, further making the touch display device 100A to display the full-color screen. Furthermore, the backlight unit 180 may also be turned on when the first particles 122 approach the display surface (approach the outer surface of the substrate 110), which further improves the brightness of the touch display device 100A.

Figure 5:
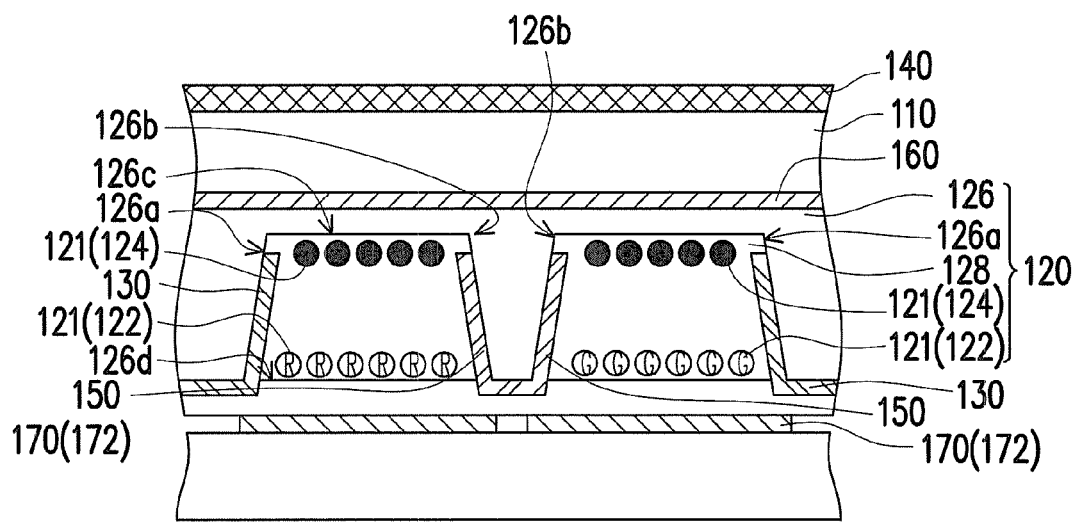
FIG. 5 illustrates a case in which part of the region in the touch display device of FIG. 4 is in a dark state.

FIG. 5 illustrates a case in which part of the region in the touch display device of FIG. 4 is in a dark state. Referring to FIG. 5, no voltage may be applied to the first side electrode 130 which corresponds to one of the micro-structures 126, no voltage may be applied to the second side electrode 150 which corresponds to one of the micro-structures 126, the positive voltage may be applied to the front electrode 160, and the negative voltage may be applied to the back electrode 170. At this point, the positively charged first particles 122 and the negatively charged second particles 124 may be attracted by the back electrode 170 and the front electrode 160 respectively and cover the bottom surface 126d and the top surface 126c of the micro-structures 126 respectively. At this point, by viewing along the substrate 110 toward the micro-structures 126, the regions which correspond to the micro-structures 126 in the touch display device 100A may present the color of the second particles 124, further making the touch display device 100A to display the black screen or the white screen.

The Third Embodiment

Figure 6:
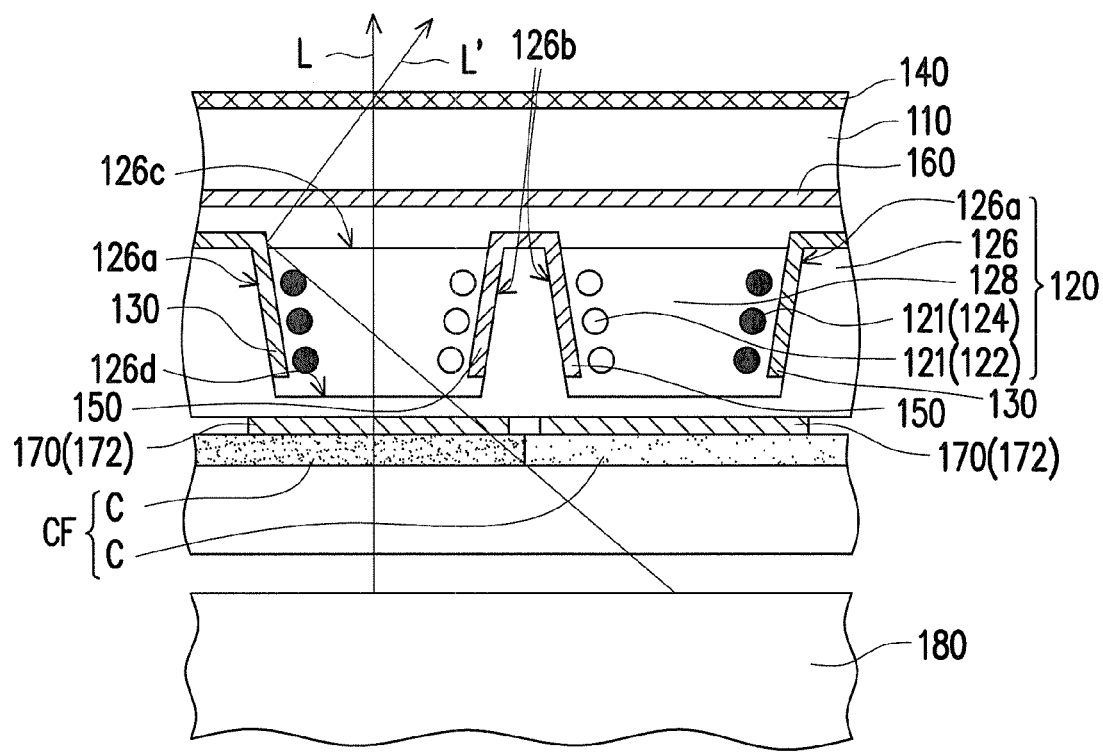
FIG. 6 illustrates a schematic cross-sectional view of a touch display device according to the third embodiment of the invention.

FIG. 6 illustrates a schematic cross-sectional view of a touch display device according to the third embodiment of the invention. Referring to FIG. 6, the touch display device 100B of the present embodiment is similar to the touch display device 100 in the first embodiment, and thus the same reference numbers are used to refer to the same or like elements. The operation modes of touch display device 100B are the same as those of the touch display device 100. The main differences between the touch display device 100B and the touch display device 100 are that the inclination directions of the first side electrodes 130 and the second side electrodes 150 of the touch display device 100B are different from the inclination directions of the first side electrodes 130 and the second side electrodes 150 of the touch display device 100. The differences between the both are illustrated in the following, and the same parts of the both are not reiterated herein.

In the present embodiment, the first side wall 126a and the second side wall 126b may face and incline to the substrate 110, making the first side electrodes 130 and the second side electrodes 150 which are disposed above the first side wall 126a and the second side wall 126b respectively also to face and incline to the substrate 110. The materials of the first side electrodes 130 and the second side electrodes 150 may be selectively used the reflective conductive materials, such as metals or other suitable materials. Similar to the touch display device 100, the positive voltage may be applied to the first side electrode 130 which corresponds to the micro-structure 126, the negative voltage may be applied to the second side electrode 150 which corresponds to the micro-structure 126, no voltage may be applied to the front electrode 160 and the back electrode 170, and the backlight unit 180 is made to emit the light beam L. At this point, it is noted that a light beam L' which does not directly pass through the display medium layer 120 may be reflected by the first side electrodes 130 and the second side electrodes 150 and be transmitted toward the substrate 110. In other words, through the first side electrodes 130 and the second side electrodes 150 which face and incline to the substrate 110, more light beam L' may be passed through the display medium layer 120, which further improves the brightness of the touch display device 100B.

The Forth Embodiment

Figure 7:
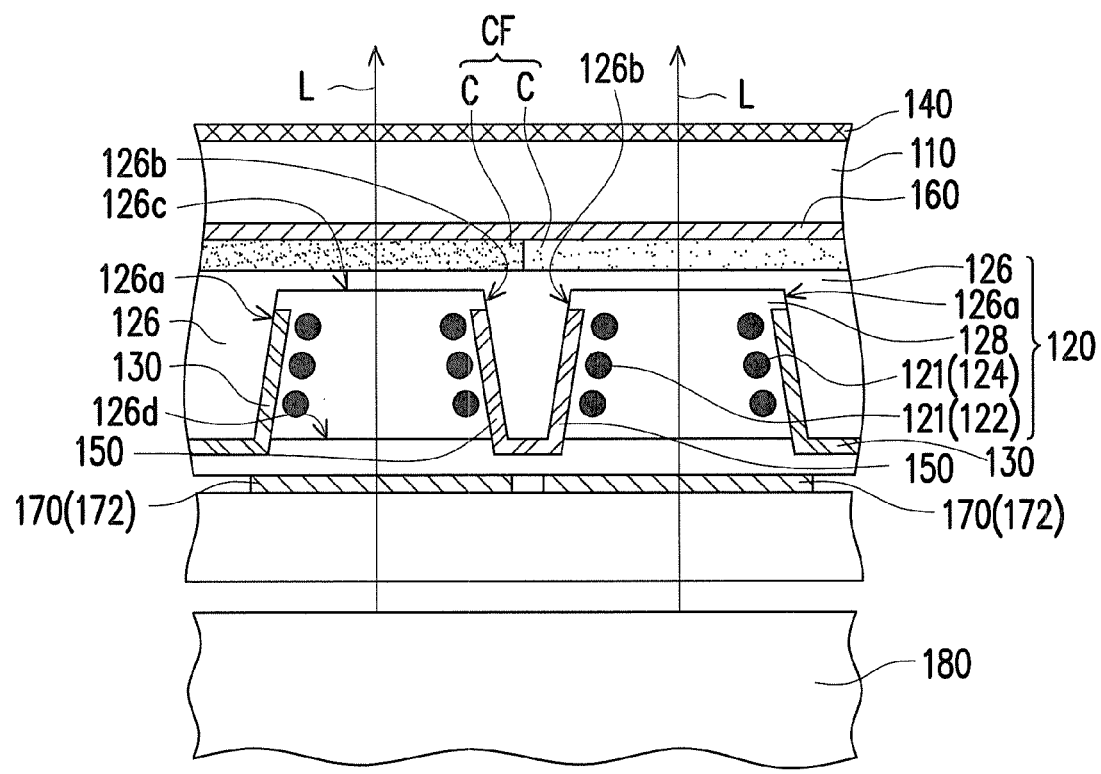
FIG. 7 illustrates a schematic cross-sectional view of a touch display device according to the forth embodiment of the invention.

FIG. 7 illustrates a schematic cross-sectional view of a touch display device according to the forth embodiment of the invention. Referring to FIG. 7, the touch display device 100C of the present embodiment is similar to the touch display device 100 in the first embodiment, and thus the same reference numbers are used to refer to the same or like elements. The main differences between the touch display device 100C and the touch display device 100 are that the charged particles 121 in the touch display device 100C are not the same as those in the touch display device 100, and the position of the color filter layer CF in the touch display device 100C is different from the position of the color filter layer CF in the touch display device 100. The differences between the both are illustrated in the following, and the same parts of the both are not reiterated herein.

In the present embodiment, the electrical properties of the charged particles 121 may be the same. In other words, the charged particles 121 may all be positively charged or all be negatively charged. The charged particles 121 are the same color (such as one of the red color, the green color, the yellow color, the blue color), black or white. Furthermore, in the present embodiment, the color filter layer CF may not be disposed below the display medium layer 120. In detail, the color filter layer CF of the invention may be disposed above the display medium layer 120. Specifically, the color filter layer CF may be disposed between the substrate 110 and the display medium layer 120. However, the invention is not limited thereto. In another embodiment, the color filter layer CF may also be disposed in other suitable positions.

According to the above, in the touch display device of an embodiment of the invention, the touch sensing unit is composed by the first side electrodes which are disposed in the interior and the sensing electrode. Thereby, the touch display device has the advantage of thinness.

Furthermore, in the touch display device of an embodiment of the invention, the first particles and the second particles may move toward the second side wall and the first side wall of the micro-structures respectively through being attracted by the first side electrodes and the second side electrodes, which further makes the top surface and the bottom surface of the micro-structures to be exposed. Accordingly, the light beam provided by the backlight unit can then pass through the display medium layer, which further allows the touch display device to have the high brightness.

In addition, in the touch display device of an embodiment of the invention, through the color filter layer or the colorful first particles, the touch display device may have the high color saturation.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A touch display device, comprising:
    a substrate;
    a display medium layer, disposed on the substrate, and the display medium layer comprises:
        charged particles; and
        micro-structures, wherein the micro-structures are connected to each other, and each of the micro-structures holds a portion of the charged particles and has a first side wall which is not parallel to the substrate;
    first side electrodes, wherein each of the first side electrodes is disposed along the first side wall of each of the micro-structures, and the micro-structures are disposed between the substrate and the first side electrodes;
    a sensing electrode, disposed on the substrate, wherein the sensing electrode and the first side electrodes compose a touch sensing unit;
    a front electrode, disposed between the substrate and the micro-structures; and
    a back electrode, wherein the display medium layer is disposed between the front electrode and the back electrode.

2. The touch display device as claimed in claim 1, wherein the substrate is disposed between the sensing electrode and the micro-structures.

3. The touch display device as claimed in claim 1, further comprising:
    second side electrodes, electrically insulated to the first side electrodes, wherein each of the second side electrodes is disposed above a second side wall of each of the micro-structures, the second side wall is opposite to the first side wall and is not parallel to the substrate, and the micro-structures are disposed between the substrate and the second side electrodes.

4. The touch display device as claimed in claim 3, wherein the first side electrodes, the second side electrodes, and the sensing electrode compose the touch sensing unit.

5. The touch display device as claimed in claim 3, wherein the display medium layer, the first side electrodes, and the second side electrodes are disposed between the front electrode and the back electrode.

6. The touch display device as claimed in claim 5, further comprising:
    a backlight unit, wherein the display medium layer, the first side electrodes, and the second side electrodes are disposed between the substrate and the backlight unit.

7. The touch display device as claimed in claim 6, further comprising:
    a color filter layer, wherein the backlight unit emits a light beam and the color filter layer is disposed in a transmission path of the light beam.

8. The touch display device as claimed in claim 6, wherein a voltage applied to one of the first side electrodes which are corresponded to one of the micro-structures is positive, a voltage applied to one of the second side electrodes which are corresponded to one of the micro-structures is negative, two voltages applied respectively to the front electrode and the back electrode are zero, the backlight unit emits a light beam, and the light beam passes through the display medium layer.

9. The touch display device as claimed in claim 6, wherein a voltage applied to the first side electrode which is corresponded to one of the micro-structures and a voltage applied to the second side electrode which is corresponded to the micro-structure are zero, a voltage applied to one of the front electrode and the back electrode is positive, and a voltage applied to the another of the front electrode and the back electrode is negative.

10. The touch display device as claimed in claim 9, wherein the charged particles are divided into first particles and second particles, the first particles and the second particles have opposite electrical properties, the first particles are white particles, and the second particles are black particles.

11. The touch display device as claimed in claim 5, wherein the charged particles are divided into first particles and second particles, the first particles and the second particles have opposite electrical properties, the first particles are colorful, and the second particles are black or white.

12. The touch display device as claimed in claim 11, wherein a voltage applied to one of the first side electrodes which are corresponded to one of the micro-structures is zero, a voltage applied to one of the second side electrodes which are corresponded to one of the micro-structures is zero, a voltage applied to the front electrode is one of a positive voltage and a negative voltage, and a voltage applied to the back electrode is another one of the positive voltage and the negative voltage.

13. The touch display device as claimed in claim 5, wherein the charged particles have the same electrical properties and are the same color, black, or white.

* * * * *